(12) United States Patent
Davis

(10) Patent No.: US 9,377,845 B2
(45) Date of Patent: Jun. 28, 2016

(54) FRAME BUFFER POWER MANAGEMENT

(71) Applicant: LENOVO (Singapore) PTE, LTD., New Tech Park (SG)

(72) Inventor: Mark Charles Davis, Durham, NC (US)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 90 days.

(21) Appl. No.: 14/274,316

(22) Filed: May 9, 2014

(65) Prior Publication Data

US 2015/0323982 A1    Nov. 12, 2015

(51) Int. Cl.
*G06F 3/038* (2013.01)
*G06F 1/32* (2006.01)
*G11C 7/10* (2006.01)

(52) U.S. Cl.
CPC ............ *G06F 1/3293* (2013.01); *G06F 1/3243* (2013.01); *G11C 7/1072* (2013.01)

(58) Field of Classification Search
CPC ............. G09G 2330/021; G09G 5/12; G09G 2360/18; G09G 2330/022; G06F 1/3265; G06F 1/3287
See application file for complete search history.

(56) References Cited

U.S. PATENT DOCUMENTS

| 2011/0157202 A1* | 6/2011 | Kwa | G09G 5/395 345/547 |
| 2013/0054998 A1* | 2/2013 | Wyatt | G06F 1/3265 713/323 |

OTHER PUBLICATIONS

"Spin-transfer torque magnetic random access memory (STT-MRAM)", Dmytro Apalkov et al., May 2013, ACM Digital Library.*

* cited by examiner

*Primary Examiner* — Hau Nguyen
(74) *Attorney, Agent, or Firm* — Kunzler Law Group

(57) ABSTRACT

For frame buffer power management, a frame buffer includes a write circuit and a read circuit, and drives a display. A power management module terminates power to the frame buffer in response to a power reduction policy being satisfied.

16 Claims, 5 Drawing Sheets

FRAME BUFFER POWER MANAGEMENT

BACKGROUND

1. Field

The subject matter disclosed herein relates to frame buffers and more particularly relates to frame buffer power management.

2. Description of the Related Art

Frame buffers provide pixel values for electronic device displays. Reducing the power consumption of a frame buffer increase the battery life and/or reduces the environment footprint of the electronic device.

BRIEF SUMMARY

An apparatus for frame buffer power management is disclosed. The apparatus includes a frame buffer and a power management module. The frame buffer includes a write circuit and a read circuit, and drives a display. The power management module terminates power to the frame buffer in response to a power reduction policy being satisfied. A method and computer program product also perform the functions of the apparatus.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
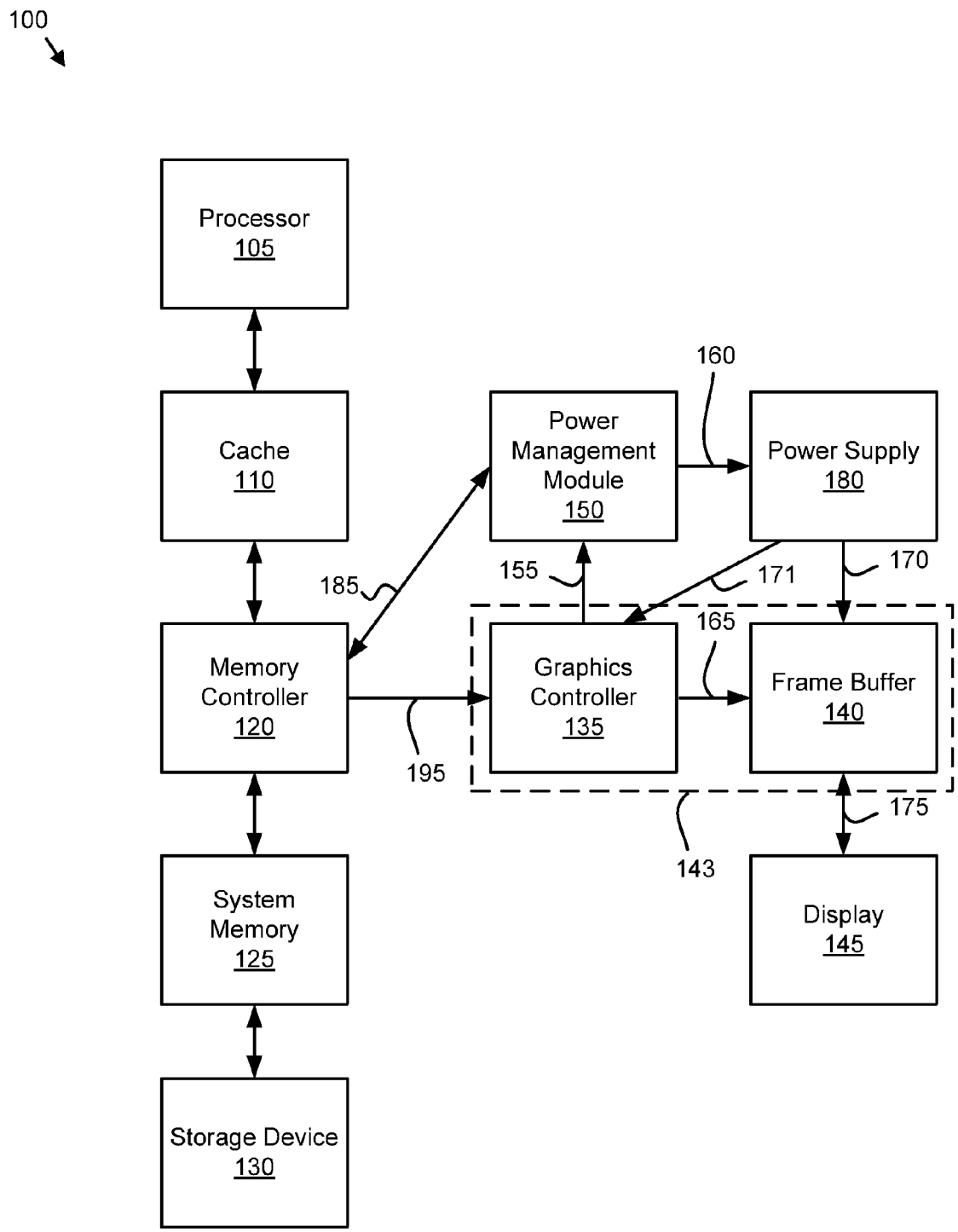
FIG. 1 is a schematic block diagram illustrating one embodiment of an electronic device.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages, including an object oriented programming language such as Java, Smalltalk, C++ or the like and conventional procedural programming languages, such as the "C" programming language or similar programming languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 is a schematic block diagram illustrating one embodiment of an electronic device 100. The electronic device 100 may be a computer workstation, a laptop computer, tablet computer, a mobile telephone, a server, and the like. The electronic device 100 includes components including a processor 105, a cache 110, a memory controller 120, a system memory 125, the storage device 130, a power management module 150, a graphics controller 135, a power supply 180, a frame buffer 140, and a display 145. The cache 110, system memory 125, and storage device 130 may store code. The processor 105 may execute the code. The components of the electronic device 100 may comprise semiconductor circuits organized as one or more semiconductor devices.

In one embodiment, the processor 105 generates graphics input 195 for the graphics controller 135. The graphics controller 135 may generate pixel values 165 that are stored in the frame buffer 140. The display 145 may read the pixel values 175 from the frame buffer 140 and display the pixel values 175. The graphics controller 135 and the frame buffer 140 may be embodied in a graphics adapter 143. The graphics adapter 143 may further comprise a graphics processor (not shown). The power supply 180 may supply adapter power 171 to the graphics controller 135 and other components of the graphics adapter 143.

The power supply 180 may supply power 170 to the frame buffer 140 and other components the electronic device 100. The power management module 150 may manage the supply of power 170 to the frame buffer 140 and other components the electronic device 100. In one embodiment, the power management module 150 may manage the power 170 in response to power management commands 185 that are generated by the processor 105 and/or power management logic embedded in a component comprising the memory controller 120. Alternatively, the power management module 150 may independently make some power management decisions.

In the past, power management options for the frame buffer 140 were limited. For example, the frame buffer 140 could be powered down, but only if the display 145 did not display an image. As a result, there were fewer opportunities for power management, and power management was often only utilized when the electronic device 100 was put to sleep.

The embodiments described herein manage the power 170 of the frame buffer 140 to further reduce the power consumption of the frame buffer 140 and the electronic device 100. In one embodiment, the frame buffer 140 comprises magnetic random-access memory (MRAM). In a certain embodiment, the MRAM is spin torque transfer random-access memory (STT-RAM). Alternatively, the frame buffer 140 may employ double data rate synchronous dynamic random access memory (DDR SDRAM) and/or graphics double data rate synchronous dynamic random access memory (GDDR SDRAM).

In one embodiment, the graphics controller 135 may communicate a no-pixel-update signal 155 to the power management module 150. The no-pixel-update signal 155 may indicate to the power management module 150 that the graphics controller 135 is not updating the pixel values 165 to the frame buffer 140. In response to the power management commands 185 and/or the no-pixel-update signal 155, the power management module 150 may generate power controls 160 that cause the power supply 180 to modify the power 170 to the frame buffer 140, allowing the power management module 150 to manage the power consumption of the frame buffer 140. The power management module 150 may further manage power to the display 145, the graphics adapter 143, and other components in the electronic device 100.

Figure 2:
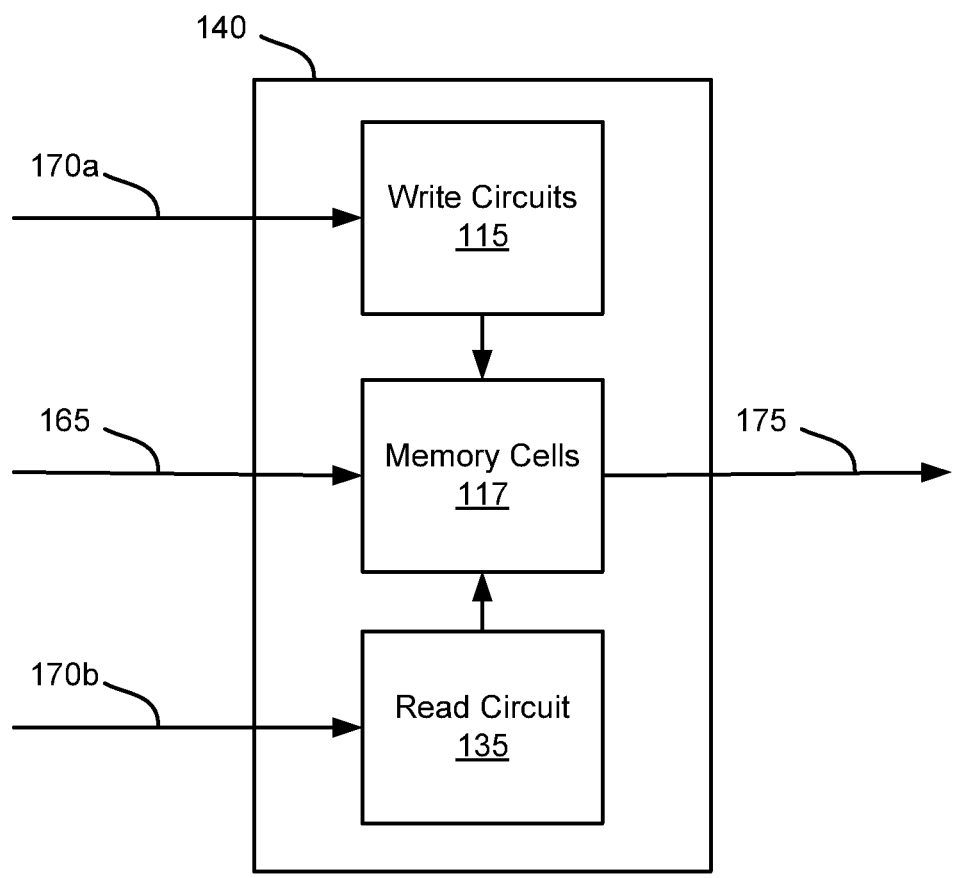
FIG. 2 is a schematic block diagram illustrating one embodiment of a frame buffer.

FIG. 2 is a schematic block diagram illustrating one embodiment of a frame buffer 140. The frame buffer 140 is the frame buffer 140 of FIG. 1. In the depicted embodiment, the frame buffer 140 includes a write circuit 115, memory cells 117, and a read circuit 135. The memory cells 117 may be MRAM memory cells 117.

The write circuit 115 may write pixel values 165 to the memory cells 117. The write circuit 115 may receive dedicated write circuit power 170a from the power supply 180. When the write circuit power 170a is terminated to the write circuit 115, the frame buffer 140 is unable to write pixel values 165 to the memory cells 117. However, if the memory cells 117 are MRAM memory cells 117, the pixel values stored in the memory cells 117 persist and may still be read from the memory cells 117. When the write circuit power 170a is activated, the pixel values 165 may again be written to the memory cells 117.

The read circuit 135 may read pixel values 175 from the memory cells 117. If the write circuit power 170a is terminated to the write circuit 115, the read circuit 135 may still read pixel values 175 from the memory cells 117. The read circuit 135 may receive dedicated read circuit power 170b from the power supply 180. If the read circuit power 170b is terminated to the read circuit 135, pixel values 175 may not be read from the memory cells 117. However, if the memory cells 117 are MRAM memory cells 117, the pixel values 175 stored in the memory cells 117 persist and may be read from the memory cells 117 when the read circuit power 170b is activated.

Figure 3:
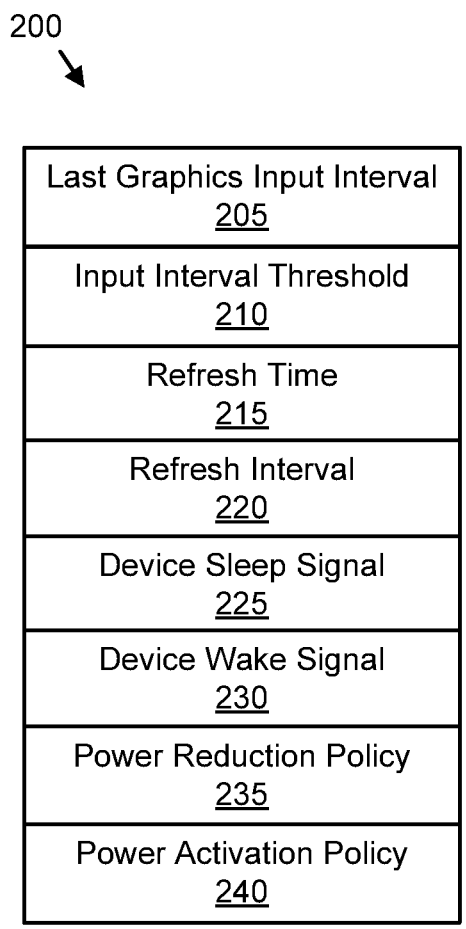
FIG. 3 is a schematic block diagram illustrating one embodiment of power management data.

FIG. 3 is a schematic block diagram illustrating one embodiment of power management data 200. The power management data 200 may be stored in one or more hardware registers of semiconductor circuits. Alternatively, the power management data 200 may be stored in a data structure. The power management data 200 may reside in the power management module 150, the power supply 180, the frame buffer 140, the graphics controller 135, the memory controller 120, or combinations thereof.

In the depicted embodiment, the power management data 200 includes a last graphics input interval 205, an input interval threshold 210, a refresh time 215, a refresh interval 220, a device sleep signal 225, a device wake signal 230, a power reduction policy 235, and a power activation policy 240. The last graphics input interval 205 may be a time interval from an assertion of the no-pixel-update signal 155. In one embodiment, the last graphics input interval 205 comprises a timer that is reset and started when the no-pixel-update signal 155 is asserted, and cleared when the no-pixel-update signal 155 is de-asserted.

The input interval threshold 210 may specify a time interval. In one embodiment, when the last graphics input interval 205 exceeds the input interval threshold 210, write circuit power 170a may be terminated to the write circuit 115, read circuit power 170b may be terminated to the read circuit 135, or combinations thereof as will be described hereafter.

The refresh time 215 may record a time interval from the last refresh of the display 145. In one embodiment, the refresh time 215 comprises a timer that is reset each time the display 145 is refreshed. The refresh interval 220 may specify a time interval for refreshing the display 145. For example, the display 145 may be designed to be refreshed after the refresh interval 220. When the refresh time 215 exceeds the refresh interval 220, the read circuit power 170b may be activated so that the pixel values 175 may be read from the frame buffer 140 as will be described hereafter.

The device sleep signal 225 and the device wake signal 230 may be incorporated in the power management commands 185. In one embodiment, the device sleep signal 225 and/or the device wake signal 230 is a dedicated signal in a bus of power management commands 185. Alternatively, the device sleep signal 225 and/or the device wake signal 230 may be an encoded command communicated over the power management commands 185.

The device sleep signal 225 and/or the device wake signal 230 may be received by the power management module 150 and stored in registers. When the device sleep signal 225 is asserted, the power management module 150 may power down the electronic device 100. In addition, when the device wake signal 230 is asserted, the power management module 150 may power up the electronic device 100.

The power reduction policy 235 may specify when to terminate power to the frame buffer 140. Alternatively, the power reduction policy 235 may specify when to terminate power to the write circuit 115 and/or the read circuit 135. In addition, the power reduction policy 235 may specify when to terminate power to the graphics adapter 143 and/or the graphics controller 135 as will be described hereafter.

The power activation policy 240 may specify when to activate power to the frame buffer 140. Alternatively, the power activation policy 240 may specify when to activate power to the write circuit 115 and/or the read circuit 135. In addition, the power activation policy 240 may specify when to activate power to the graphics adapter 143 and/or the graphics controller 135 as will be described hereafter.

Figure 4A:
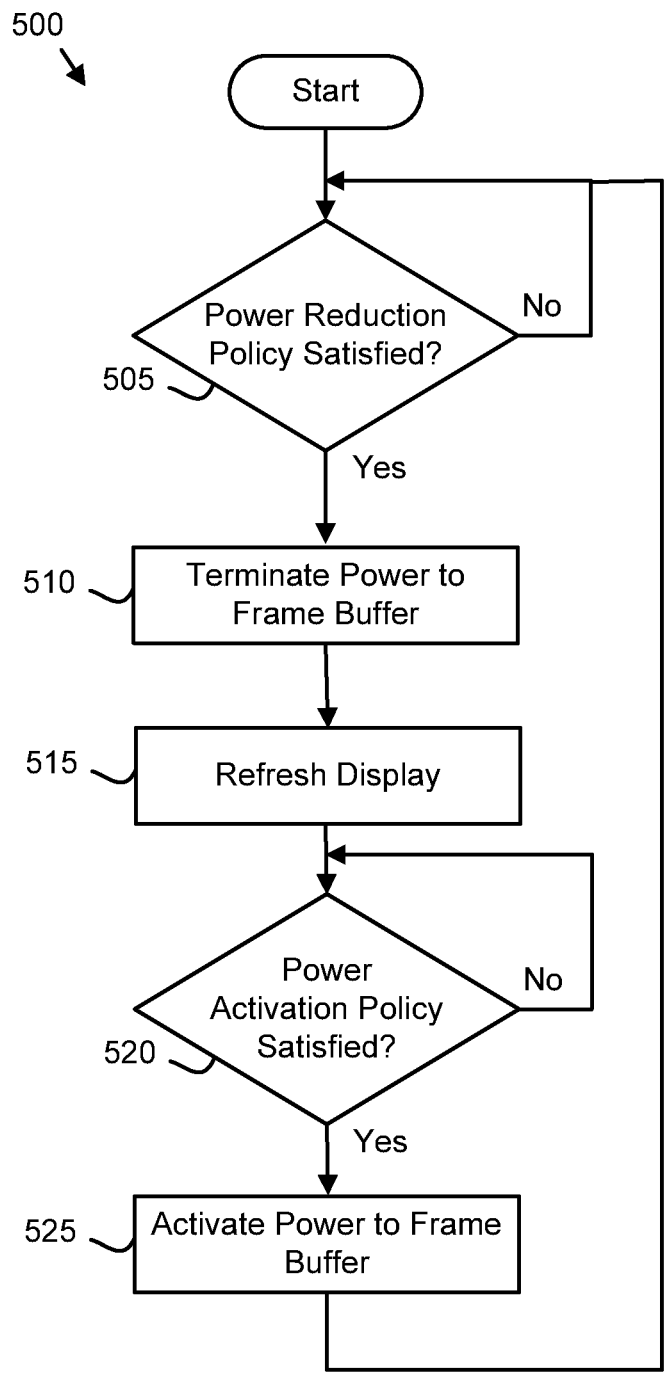
FIG. 4A is a schematic flow chart diagram illustrating one embodiment of a power management method.

FIG. 4A is a schematic flow chart diagram illustrating one embodiment of a power management method 500. The method 500 may be performed by semiconductor circuits embodied in one or more of the power management module 150, the power supply 180, the graphics controller 135, the frame buffer 140, the display 145, and the memory controller 120. Alternatively, the method 500 may be performed by computer readable storage medium storing code that when executed by the processor 105 performs the functions of the method 500.

The method 500 starts, and in one embodiment, the power management module 150 determines 505 if the power reduction policy 235 is satisfied. The power reduction policy 235 may be satisfied in response to the last graphics input interval 205 exceeding the input interval threshold 210.

Alternatively, the power reduction policy 235 is satisfied in response to the device sleep signal 225. For example, the power reduction policy 235 may be satisfied if the device sleep signal 225 is asserted and/or latched.

If the power reduction policy 235 is not satisfied, the power management module 150 continues to determine 505 if the power reduction policy 235 is satisfied. If the power reduction policy 235 is satisfied, the power management module 150 may terminate 510 power 170 to the frame buffer 140 in response to the power reduction policy 235 being satisfied. In one embodiment, the power management module 150 may terminate 510 power 170 to the frame buffer 140 by generating the power controls 160. The power controls 160 may cause the power supply 180 to terminate 510 the write circuit power 170a, the read circuit power 170b, or combinations thereof.

In one embodiment, the write circuit power 170a is terminated to the write circuit 115 in response to the last graphics input interval 205 exceeding the input interval threshold 210. In addition, the adapter power 171 may be terminated to the graphics adapter 143 in response to the last graphics input interval 205 exceeding the input interval threshold 210.

In one embodiment, the write circuit power 170a is terminated to the write circuit 115 and the read circuit power 170b is terminated to the read circuit 135 in response to the device sleep signal 225. In addition, the adapter power 171 may be terminated to the graphics adapter 143 in response to the device sleep signal 225.

In one embodiment, while the power 170 is terminated to the write circuit 115 and the read circuit 135, the power management module 150 may refresh 515 the display 145. Refreshing 515 the display 145 is described in greater detail in FIG. 4B. Table 1 illustrates examples of power reduction policy conditions and resulting power management module responses.

TABLE 1

| Power Production Policy Condition | Power Management Module Response |
|---|---|
| Last graphics input interval 205 exceeds the input interval threshold 210. | Terminate write circuit power 170a and read circuit power 170b. |
| Last graphics input interval 205 exceeds the input interval threshold 210. | Terminate power 170 and adapter power 171. |
| Device sleep signal 225 | Terminate write circuit power 170a and read circuit power 170b. |

The power management module 150 may further determine 520 if the power activation policy 240 is satisfied. In one embodiment, the power activation policy 240 is satisfied in response to the refresh time 215 exceeding the refresh interval 220. Alternatively, the power activation policy 240 may be satisfied in response to the graphics input 195. For example, the processor 105 may generate the graphics input 195 and communicate the graphics input 195 to the graphics controller 135 in order to update the display 145. The graphics input 195 to the graphics controller 135 may cause the graphics controller 135 to de-assert the no-pixel-update signal 155.

In an alternate embodiment, the power activation policy 240 is satisfied in response to the device wake signal 230. For example, the device wake signal 230 may be generated in response to an input to the electronic device 100. The device wake signal 230 may be communicated as part of the power management commands 185 to the power management module 150.

If the power activation policy 240 is not satisfied, the power management module 150 may continue to determine 520 if the power management policy 240 is satisfied. If the power management policy 240 is satisfied, the power management module 150 may activate 525 power 170 to the frame buffer 140. Alternatively, the power management module 150 may activate 525 write circuit power 170a to the write circuit 115, read circuit power 170b to the read circuit 135, or combinations thereof.

The power management module 150 may activate 525 write circuit power 170a to the write circuit 115 and read circuit power 170b to the read circuit 135 in response to a de-assertion of the no-pixel-update signal 155 and/or in response to a graphics input 195. For example, if the processor 105 resumes communicating graphics input 195 to the graphics controller 135, the graphics controller may de-assert the no-pixel-update signal 155 and the management module 150 may activate 525 write circuit power 170a to the write circuit 115 and/or read circuit power 170b to the read circuit 135.

The power management module 150 may activate 525 write circuit power 170a to the write circuit 115 and read circuit power 170b to the read circuit 135 in response to the device wake signal 230. For example, if the device wake signal 230 is received as part of the power management commands 185, the power management module 150 may activate 525 write circuit power 170a to the write circuit 115 and/or read circuit power 170b to the read circuit 135. In addition, the power management module 150 may continue to determine 505 if the power reduction policy 235 is satisfied.

Table 2 illustrates examples of power activation policy conditions and corresponding power management module responses.

TABLE 2

| Power Activation Policy Condition | Power Management Module Response |
|---|---|
| Graphics input 195. | Activate write circuit power 170a and read circuit power 170b. |
| De-assert no-pixel-update signal 155. | Activate write circuit power 170a and read circuit power 170b. |
| Device wake signal 230. | Activate write circuit power 170a and read circuit power 170b. |

Figure 4B:
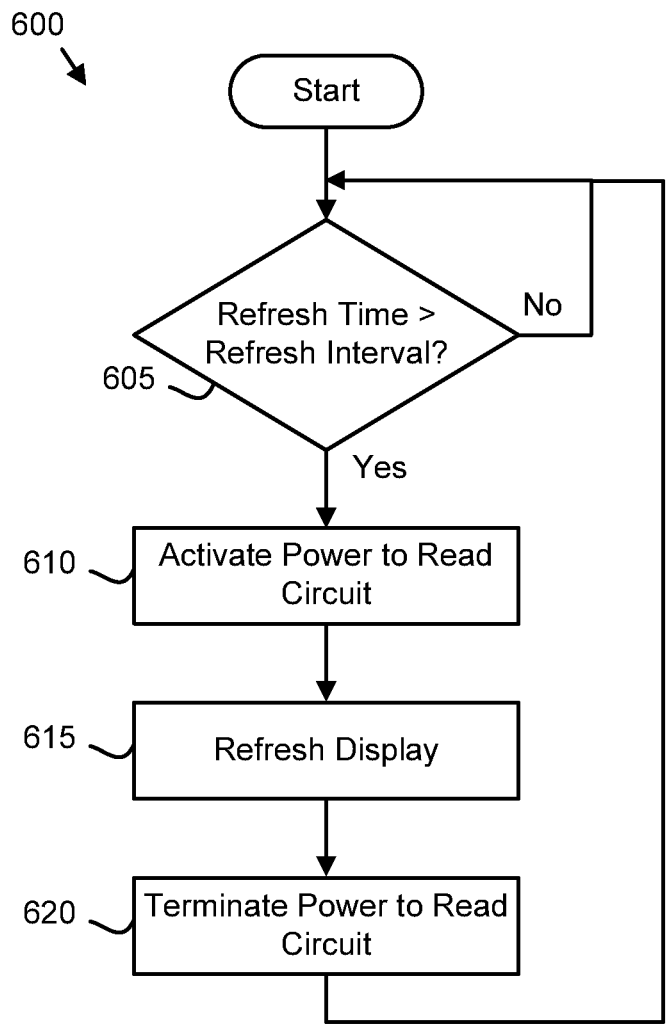
FIG. 4B is a schematic flow chart diagram illustrating one embodiment of a refresh power management method.

FIG. 4B is a schematic flow chart diagram illustrating one embodiment of a refresh power management method 600. The method 600 may be performed by semiconductor circuits embodied in one or more of the power management module 150, the power supply 180, the graphics controller 135, the frame buffer 140, the display 145, and the memory controller 120. Alternatively, the method 600 may be performed by computer readable storage medium storing code that when executed by the processor 105 performs the functions of the method 600.

The method 600 starts, and in one embodiment, the power management module 150 determines 605 if the refresh time 215 is greater than the refresh interval 220. If the refresh time 215 is not greater than the refresh interval 220, the power management module 150 continues to determine 605 if the refresh time 215 is greater than the refresh interval 220.

If the refresh time 215 is greater than the refresh interval 220, the power management module 150 may activate 610 read circuit power 170b to the read circuit 135. In addition, the power module 150 may reset the refresh time 215.

With the read circuit power 170b activated, the display 145 may read the pixel values 175 from the frame buffer 140 using the read circuit 135 and refresh 615 the display 145. As a result, the write circuit 115 may be powered down while the read circuit 135 continues to provide pixel values 175 from the memory cells 117.

In response to refreshing 615 the display 145, the power management module 150 may terminate 620 power to the read circuit power 170b to the read circuit 135, and the power management module 150 may continue to determine 605 if the refresh time 215 is greater than the refresh interval 220.

The embodiments increase opportunities for power reduction in a graphics adapter 143 with a frame buffer 140 that includes a write circuit 115 and a read circuit 135 that are powered separately. The embodiments may terminate write circuit power 170a to the write circuit 115 while providing read circuit power 170b to the read circuit 135. In addition, the embodiments may only provide read circuit power 170b during a refresh of the display 145. Thus the embodiments may continue to drive the display 145 while significantly reducing the power consumption of the frame buffer 140.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   a frame buffer comprising a write circuit, magnetic random-access memory (MRAM) cells, and a read circuit and that drive a display, wherein the write circuit writes pixel values to the MRAM cells and the read circuit reads the pixel values from the MRAM cells; and
   a power management module of semiconductor gates that terminates power to the write circuit and maintains power to the read circuit in response to a power reduction policy being satisfied, wherein the power reduction policy is satisfied in response to a last graphics input interval exceeding an input interval threshold and the last graphics input interval is a time interval from a no-pixel update signal.

2. The apparatus of claim 1, wherein the power is terminated to a graphics adapter in response to the last graphics input interval exceeding the input interval threshold.

3. The apparatus of claim 1, wherein the power reduction policy is satisfied in response to a device sleep signal and the power is terminated to the write circuit and the read circuit in response to the device sleep signal.

4. The apparatus of claim 1, wherein the power management module further activates power to the frame buffer in response to a power activation policy being satisfied.

5. The apparatus of claim 4, wherein the power activation policy is satisfied in response to a refresh time exceeding a refresh interval and the power management module activates power to the read circuit in response to the refresh time exceeding the refresh interval.

6. The apparatus of claim 4, wherein the power activation policy is satisfied in response to a graphics input and the power management module activates power to the write circuit and the read circuit in response to the graphics input.

7. The apparatus of claim 4, wherein the power activation policy is satisfied in response to a device wake signal and the power management module activates power to the write circuit and the read circuit in response to the device wake signal.

8. The apparatus of claim 1, wherein the MRAM is spin torque transfer random access memory (STT-RAM).

9. A system comprising:
   a graphics controller that generates pixel values;
   a display that displays the pixel values;
   a frame buffer comprising a write circuit, magnetic random-access memory (MRAM) cells, and a read circuit, and that drives the pixel values to the display, wherein the write circuit writes pixel values to the MRAM cells and the read circuit reads the pixel values from the MRAM cells; and
   a power management module of semiconductor gates that terminates power to the write circuit and maintains power to the read circuit in response to a power reduction policy being satisfied, wherein the power reduction policy is satisfied in response to a last graphics input interval exceeding an input interval threshold and the last graphics input interval is a time interval from a no-pixel update signal.

10. The system of claim 9, wherein the power reduction policy is satisfied in response to a device sleep signal and the power is terminated to the write circuit and the read circuit in response to the device sleep signal.

11. The system of claim 9, the power management module further activating power to the frame buffer in response to a power activation policy being satisfied.

12. The system of claim 11, wherein the power activation policy is satisfied in response to a refresh time exceeding a refresh interval and the power management module activates power to the read circuit in response to the refresh time exceeding the refresh interval.

13. A method comprising:
   determining that a power reduction policy for a frame buffer is satisfied, the frame buffer comprising a write circuit, magnetic random-access memory (MRAM) cells, and a read circuit, and driving a display, wherein the write circuit writes pixel values to the MRAM cells and the read circuit reads the pixel values from the MRAM cells; and
   terminating power to the write circuit and maintaining power to the read circuit in response to the power reduction policy being satisfied, wherein the power reduction policy is satisfied in response to a last graphics input interval exceeding an input interval threshold and the last graphics input interval is a time interval from a no-pixel update signal.

14. The method of claim 13, wherein the power reduction policy is satisfied in response to a device sleep signal and the method terminating power to the write circuit and the read circuit in response to the device sleep signal.

15. The method of claim 13, the method further activating power to the frame buffer in response to a power activation policy being satisfied.

16. The method of claim 15, wherein the power activation policy is satisfied in response to a refresh time exceeding a refresh interval and the method further activating power to the read circuit in response to the refresh time exceeding the refresh interval.

* * * * *